United States Patent
Kwak et al.

(10) Patent No.: US 7,387,919 B2
(45) Date of Patent: Jun. 17, 2008

(54) METHODS OF FABRICATING A SEMICONDUCTOR DEVICE HAVING A NODE CONTACT STRUCTURE OF A CMOS INVERTER

(76) Inventors: Kun-Ho Kwak, 207, Jinseong Oneroom, Seocheon-ri 322-8, Giheung-eup, Yongin-si, Gyeonggi-do (KR); Soon-Moon Jung, 512-1401, Samsung 5-cha Apt., Bojeong-ri, Guseong-eup, Yongin-si, Gyeonggi-do (KR); Won-Seok Cho, 246-702, Hwanggol Maeul Ssangyong Apt., Yeongtong-dong, Yeongtong-gu, Suwon-si, Gyeonggi-do (KR); Jae-Hoon Jang, Cheonggye-ri 103, Dongtan-myeon, Hwaseong-si, Gyeonggi-do (KR); Jong-Hyuk Kim, Na-102, Seung-ri JuTak, Bugae 1-dong 301-1 6/6, Bupyeong-gu, Incheon (KR)

( * ) Notice: Subject to any disclaimer, the term of this patent is extended or adjusted under 35 U.S.C. 154(b) by 164 days.

(21) Appl. No.: 11/281,346

(22) Filed: Nov. 16, 2005

(65) Prior Publication Data
US 2006/0115944 A1    Jun. 1, 2006

(30) Foreign Application Priority Data
Nov. 26, 2004    (KR) .................. 10-2004-0098244

(51) Int. Cl.
  H01L 21/00    (2006.01)
  H01L 21/84    (2006.01)

(52) U.S. Cl. .................... 438/153; 438/586; 257/69; 257/368

(58) Field of Classification Search .......... 438/153–155, 438/586, 618, 622; 257/69, 368
See application file for complete search history.

(56) References Cited

U.S. PATENT DOCUMENTS 5,156,987 A    10/1992    Sandhu et al.

(Continued)

FOREIGN PATENT DOCUMENTS

KR    96-009163    7/1996

(Continued)

OTHER PUBLICATIONS

English language abstract of Korean Publication No. 96-009163.

(Continued)

*Primary Examiner*—Theresa T Doan
(74) *Attorney, Agent, or Firm*—Marger Johnson & McCollom, P.C.

(57) ABSTRACT

In one embodiment, an intrinsic single crystalline semiconductor plug is formed to pass through a lower insulating layer using a selective epitaxial growth process employing a node impurity region as a seed layer, and a single crystalline semiconductor body pattern is formed on the lower insulating layer using the intrinsic single crystalline semiconductor plug as a seed layer. When the recessed single crystalline semiconductor plug is doped with impurities having the same conductivity type as the node impurity region, a peripheral impurity region is prevented from being counter-doped. As a result, it is possible to implement a high performance semiconductor device that requires a single crystalline thin film transistor as well as a node contact structure with ohmic contact.

12 Claims, 8 Drawing Sheets

U.S. PATENT DOCUMENTS

| | | | | |
|---|---|---|---|---|
| 5,492,851 | A | * | 2/1996 | Ryou ......................... 438/152 |
| 5,888,872 | A | * | 3/1999 | Gardner et al. ............. 438/300 |
| 6,022,766 | A | | 2/2000 | Chen et al. |
| 2004/0065884 | A1 | | 4/2004 | Bhattacharyya |

FOREIGN PATENT DOCUMENTS

KR  2002-0096743  12/2002

OTHER PUBLICATIONS

English language abstract of Korean Publication No. 2002-0096743.

* cited by examiner

METHODS OF FABRICATING A SEMICONDUCTOR DEVICE HAVING A NODE CONTACT STRUCTURE OF A CMOS INVERTER

CROSS-REFERENCE TO RELATED APPLICATION

This application claims priority from Korean Patent Application No. 10-2004-0098244, filed on Nov. 26, 2004 in the Korean Intellectual Property Office, the disclosure of which is incorporated herein by reference in its entirety.

BACKGROUND OF THE INVENTION

1. Field of the Invention

The present invention relates to methods of fabricating a semiconductor device and, more particularly, to methods of fabricating a semiconductor device having a node contact structure of a complementary metal-oxide-semiconductor (CMOS) inverter.

2. Description of the Related Art

Static random access memory (SRAM) devices have advantages over many other semiconductor memory devices, with lower power consumption and higher operating speed. This is particularly true compared to dynamic random access memory (DRAM) devices. Therefore, SRAM has been widely used as a cache memory in computers and/or portable electronic appliances.

A unit cell of the SRAM device may be categorized as a load resistor SRAM cell or a CMOS SRAM cell. The load resistor SRAM cell typically employs a high load resistor as a load device, while the CMOS SRAM cell typically employs a p-channel metal-oxide-semiconductor (PMOS) transistor as a load device.

CMOS SRAM cells may be classified into two types. One type of CMOS SRAM cell is a thin film transistor (TFT) SRAM cell, which may employ TFT's stacked on a semiconductor substrate as the load device. Another type is a bulk CMOS SRAM cell, which may employ bulk transistors formed at a semiconductor substrate as the load device.

The bulk CMOS SRAM cell may exhibit higher cell stability as compared to the TFT SRAM cell and the load resistor SRAM cell. In other words, the bulk CMOS SRAM cell may have excellent low voltage characteristics and low stand-by current. This is because all of the transistors constituting the bulk CMOS SRAM cell are formed at a single crystalline semiconductor substrate. In contrast, the TFTs of the TFT SRAM cells are typically formed using a polysilicon layer as a body layer. However, the bulk CMOS SRAM cell may have lower integration density as well as weaker latch-up immunity as compared to the TFT SRAM cell. Therefore, to produce a highly integrated SRAM device having high reliability, the characteristics of the load transistors employed in the TFT SRAM cell may need to be improved.

In addition, each of the SRAM cells has a pair of node contact structures. In particular, each of the node contact structures of the TFT SRAM cell is a contact structure, which electrically connects a P-type drain region of the load transistor to an N-type drain region of a driver transistor. In this case, there is a need for an ohmic contact between the P-type drain region of the load transistor and the N-type drain region of the driver transistor.

Semiconductor devices having TFTs stacked on a semiconductor substrate are described in U.S. Pat. No. 6,022,766 to Chen, et al., entitled "Semiconductor Structure Incorporating Thin Film Transistors and Methods for Its Manufacture."

According to Chen, et al., a typical bulk transistor is formed at a single crystalline silicon substrate, and a TFT is formed over the bulk transistor. Either the source or the drain region of the bulk transistor is electrically connected to the source or drain region of the TFT through a metal plug such as a tungsten plug. Therefore, even though the bulk transistor and the TFT are an NMOS transistor and a PMOS transistor, respectively, the bulk transistor has an ohmic contact with respect to the TFT through the metal plug.

A body layer of the TFT may be formed by depositing an amorphous silicon layer on the semiconductor substrate having the metal plug, and crystallizing the amorphous silicon layer using a thermal treatment process. In this case, the body layer may be a polysilicon layer having large grains. As such, it may be difficult to convert the body layer into a perfect single crystalline silicon layer. As a result, it may be difficult to form TFTs having electrical characteristics comparable to that of the bulk transistor. Accordingly, there is a need for techniques for enhancing characteristics of the TFT stacked over a semiconductor substrate.

Further, a method of converting the body layer into a single crystalline semiconductor layer using a solid phase epitaxial process is disclosed in U.S. Pat. No. 5,156,987 to Sandhu, et al., entitled "High Performance Thin Film Transistor by Solid Phase Epitaxial Regrowth." According to Sandhu, et al., the body layer in which a channel region and source/drain regions of the TFT are formed is crystallized using a drain region of a bulk transistor formed at a semiconductor substrate as a seed layer. That is, the body layer is formed to directly contact the drain region of the bulk transistor, and the body layer is crystallized using the solid phase epitaxial process. In this case, if the bulk transistor is a NMOS transistor and the TFT is a PMOS transistor, there is a need to enhance a contact resistance characteristic between the drain regions of the bulk transistor and the TFT.

SUMMARY

In one aspect, embodiments of the present invention are directed to methods of fabricating a node contact structure, which are capable of forming a single crystalline semiconductor body layer with ohmic contact. According to one embodiment, the methods include forming a lower impurity region of a first conductivity type in a predetermined region of a semiconductor substrate. A lower insulating layer is formed on the substrate having the lower impurity region. A single crystalline semiconductor plug is formed to pass through the lower insulating layer. The single crystalline semiconductor plug is formed to be in contact with the lower impurity region. A single crystalline semiconductor body pattern is formed on the lower insulating layer. The single crystalline semiconductor body pattern is formed to cover the single crystalline semiconductor plug. An upper impurity region of a second conductivity type is formed in the single crystalline semiconductor body pattern on the single crystalline semiconductor plug. An upper insulating layer is formed on the substrate having the upper impurity region. The upper insulating layer, the upper impurity region and the single crystalline semiconductor plug are etched to form an upper node contact hole that provides a recessed single crystalline semiconductor plug on the lower impurity region. The recessed single crystalline semiconductor plug is selectively doped to form a doped semiconductor plug having the first conductivity type. A node metal plug contacting the doped semiconductor plug is formed in the upper node contact hole.

In some embodiments of the present invention, the semiconductor substrate may be a single crystalline semiconductor substrate.

In other embodiment, the first conductivity type may be an N-type, and the second conductivity type may be a P-type.

In yet another embodiment, the lower insulating layer may be formed by sequentially stacking a lower etch stop layer and a lower interlayer insulating layer having an etching selectivity with respect to the lower etch stop layer.

In still other embodiment, the single crystalline semiconductor plug may be an intrinsic single crystalline semiconductor plug. The intrinsic single crystalline semiconductor plug may be formed by patterning the lower insulating layer to form a lower node contact hole exposing the lower impurity region and growing an intrinsic single crystalline semiconductor layer in the lower node contact hole using a selective epitaxial growth process that employs the lower impurity region as a seed layer.

In yet still another embodiment, forming the single crystalline semiconductor body pattern may include forming a semiconductor body layer on the substrate having the single crystal line semiconductor plug, patterning the semiconductor body layer to form a semiconductor body pattern that covers the single crystalline semiconductor plug, and crystallizing the semiconductor body pattern using a solid phase epitaxial process that employs the single crystalline semiconductor plug as a seed layer.

In yet further embodiments, the upper insulating layer may be formed by sequentially stacking an upper etch stop layer and an upper interlayer insulating layer having an etching selectivity with respect to the upper etch stop layer.

In still further embodiments, the recessed single crystalline semiconductor plug may be selectively doped using an ion implantation process.

In yet still further embodiments, the node metal plug may be formed by forming a node metal layer on the substrate having the doped semiconductor plug and planarizing the node metal layer. The node metal layer may be formed of a metal layer exhibiting an ohmic contact with respect to both the doped semiconductor plug of the first conductivity type and the upper impurity region of the second conductivity type.

In another aspect, embodiments of the present invention are directed to methods of fabricating a semiconductor device having a node contact structure.

In still another aspect of embodiments of the present invention, there are provided methods of fabricating a CMOS SRAM device employing a node contact structure.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
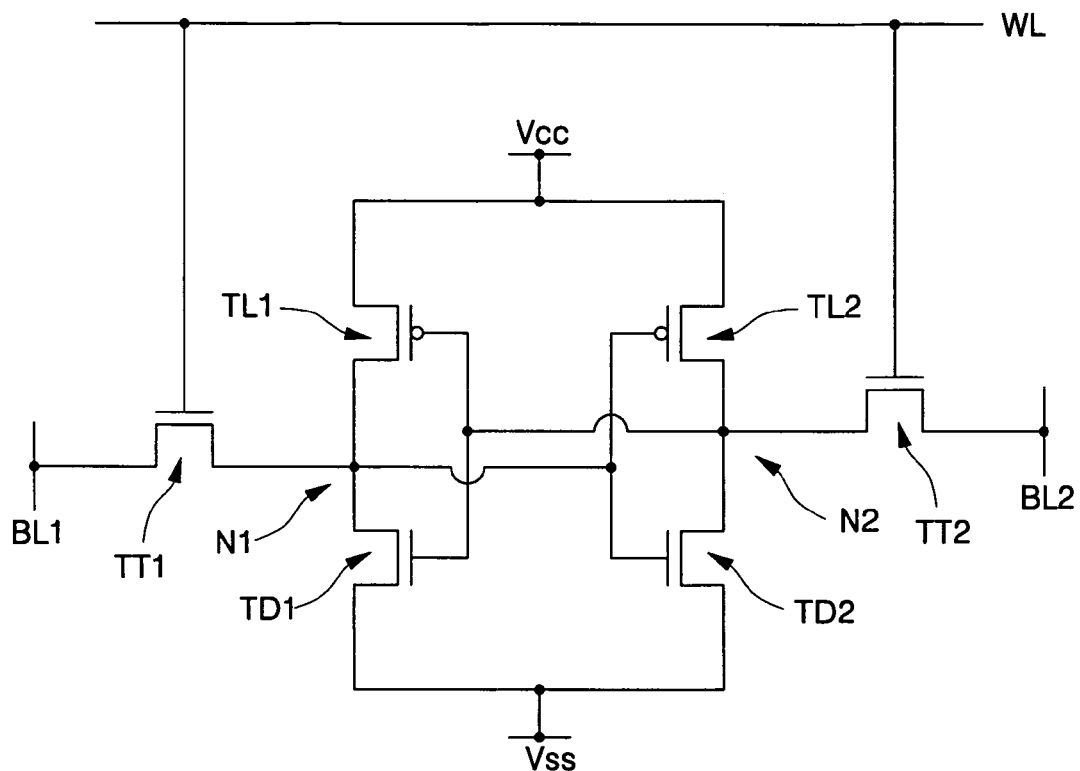
FIG. 1 is an equivalent circuit diagram of a typical CMOS SRAM cell employing a pair of cross-coupled inverters.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thicknesses of layers and regions are exaggerated for clarity. Like reference numerals in the specification denote like elements.

FIG. 1 is an equivalent circuit diagram of a CMOS SRAM cell, such as a TFT SRAM cell or a bulk CMOS SRAM cell.

Referring to FIG. 1, the CMOS SRAM cell comprises a pair of driver transistors TD1 and TD2, a pair of transfer transistors TT1 and TT2, and a pair of load transistors TL1 and TL2. The pair of driver transistors TD1 and TD2 and the pair of transfer transistors TT1 and TT2 are NMOS transistors, while the pair of load transistors TL1 and TL2 are PMOS transistors.

The first driver transistor TD1 and the first transfer transistor TT1 are serially connected to each other. A source region of the first driver transistor TD1 is electrically connected to a ground line Vss, and a drain region of the first transfer transistor TT1 is electrically connected to a first bit line BL1. Similarly, the second driver transistor TD2 and the second transfer transistor TT2 are serially connected to each other. A source region of the second driver transistor TD2 is electrically connected to the ground line Vss, and a drain region of the second transfer transistor TT2 is electrically connected to a second bit line BL2.

Source and drain regions of the first load transistor TL1 are electrically connected to a power supply line Vcc and the drain region of the first driver transistor TD1, respectively. Similarly, source and drain regions of the second load transistor TL2 are electrically connected to the power supply line Vcc and a drain region of the second driver transistor TD2, respectively. The drain region of the first load transistor TL1, the drain region of the first driver transistor TD1 and the source region of the first transfer transistor TT1 constitute a first node N1. In addition, the drain region of the second load transistor TL2, the drain region of the second driver transistor TD2 and the source region of the second transfer transistor TT2 constitute a second node N2. Gate electrodes of the first driver transistor TD1 and the first load transistor TL1 are electrically connected to the second node N2, and gate electrodes of the second driver transistor TD2 and the second load transistor TL2 are electrically connected to the first node N1. Further, gate electrodes of the first and second transfer transistors TT1 and TT2 are electrically connected to a word line WL.

The CMOS SRAM cell exhibits smaller stand-by current and larger noise margin than a load resistor SRAM cell. Therefore, the CMOS SRAM cell is widely employed in high performance SRAM's that require a low operating voltage. And comparing the two types of CMOS SRAM cells, when the TFT SRAM cell includes high performance P-channel TFTs having enhanced electrical characteristics comparable to that of P-channel bulk transistors used as load transistors of the bulk CMOS SRAM cell, the TFT SRAM cell may have advantages in terms of integration density and latch-up immunity as compared to the bulk CMOS SRAM cell.

To produce the high performance P-channel TFT, the TFT should be formed using a body pattern composed of a single crystalline semiconductor layer. In addition, ohmic contact structures should be formed at the first and second nodes N1 and N2 shown in FIG. 1.

The CMOS SRAM cell shown in FIG. 1 comprises first and second half cells. The first half cell comprises the first driver transistor TD1, the first load transistor TL1 and the first transfer transistor TT1, and the second half cell comprises the second driver transistor TD2, the second load transistor TL2 and the second transfer transistor TT2.

FIGS. 2 to 8 are cross-sectional views to illustrate methods of fabricating an SRAM device that employs a CMOS SRAM cell, shown in FIG. 1. In FIGS. 2 to 8, a reference character "C" indicates a portion of a cell array region where the CMOS SRAM cell shown in FIG. 1 is two-dimensionally and repeatedly arrayed, and a reference character "P" indicates a portion of a peripheral circuit region adjacent to the cell array region C. In more detail, the cell array region C exhibits only the first half cell of the CMOS SRAM cell shown in FIG. 1. The method of forming the second half cell may be the same as the method of forming the first half cell. Therefore, the methods of forming the second half cell will not be described in the following embodiments for the purpose of ease and convenience in explanation.

Figure 2:
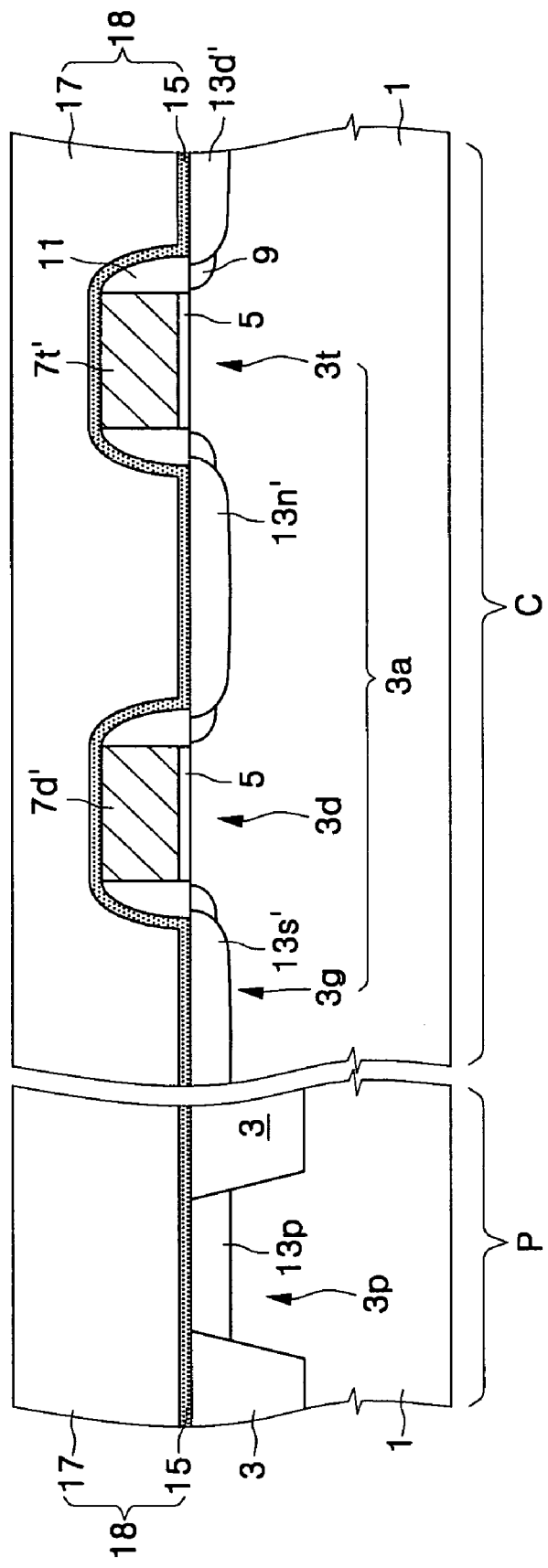
FIGS. 2 to 8 are cross-sectional views to illustrate methods of fabricating a CMOS SRAM device according to embodiments of the present invention.

Referring to FIGS. 1 and 2, an isolation layer 3 is formed in a predetermined region of a semiconductor substrate 1 having the cell array region C and the peripheral circuit region P. The isolation layer 3 defines a cell active region $3a$ and a peripheral active region $3p$ in the cell array region C and the peripheral circuit region P, respectively. The semiconductor substrate 1 may be a single crystalline semiconductor substrate. For example, the semiconductor substrate 1 may be a single crystalline silicon substrate.

The cell active region $3a$ may comprise a driver transistor active region $3d$ and a transfer transistor active region $3t$ adjacent to the driver transistor active region $3d$. In addition, the cell active region $3a$ may further comprise a ground active region $3g$ adjacent to the driver transistor active region $3d$.

A first driver transistor (TD1 of FIG. 1) is formed at the driver transistor active region $3d$ using a typical method. That is, the first driver transistor TD1 may be formed to have a ground impurity region $13s'$ and a node impurity region $13n'$ separated from each other in the driver transistor active region $3d$ as well as a driver gate electrode $7d'$ crossing over a channel region between the ground impurity region $13s'$ and the node impurity region $13n'$. The ground impurity region $13s'$ may extend to the ground active region $3g$. The ground impurity region $13s'$ and the node impurity region $13n'$ may be doped with N-type impurities. The ground impurity region $13s'$ and the node impurity region $13n'$ serve as source and drain regions of the first driver transistor TD1.

A first transfer transistor (TT1 of FIG. 1) sharing the node impurity region $13n'$ may be additionally formed in the transfer transistor active region $3t$ during formation of the first driver transistor TD1. The first transfer transistor TT1 may be formed to have the node impurity region $13n'$ and a bit line impurity region $13d'$ separated from the node impurity region $13n'$ as well as a transfer gate electrode $7t'$ crossing over a channel region between the node impurity region $13n'$ and the bit line impurity region $13d'$. The bit line impurity region $13d'$ is formed to have the same conductivity type as the ground impurity region $13s'$ and the node impurity region $13n'$. The transfer gate electrode $7t'$ may extend to serve as a word line (WL of FIG. 1).

The driver gate electrode $7d'$ and the transfer gate electrode $7t'$ are insulated from the cell active region $3a$ by a gate insulating layer 5. Further, gate spacers 11 may be formed on sidewalls of the driver gate electrode $7d'$ and the transfer gate electrode $7t'$. In this case, LDD (Lightly Doped Drain) regions 9 extending from the ground, node and bit line impurity regions $13s'$, $13n'$, and $13d'$ may be formed below the gate spacers 11. The LDD regions 9 may have the same conductivity type as the impurity regions $13s'$, $13n'$ and $13d'$. The LDD regions 9 may be formed by implanting impurity ions into the cell active region $3a$ using the driver gate electrode $7d'$ and the transfer gate electrode $7t'$ as ion implantation masks. In addition, the ground, node, and bit line impurity regions $13s'$, $13n'$, and $13d'$ may be formed by implanting impurity ions into the cell active region $3a$ using the driver gate electrode $7d'$, the transfer gate electrode $7t'$ and the gate spacers 11 as ion implantation masks.

A peripheral impurity region $13p$ may be formed in the peripheral active region $3p$. The peripheral impurity region $13p$ may have the same conductivity type as the ground, node and bit line impurity regions $13s'$, $13n'$, and $13d'$. Alternatively, the peripheral impurity region $13p$ may have a different conductivity type from the ground, node, and bit line impurity regions $13s'$, $13n'$, and $13d'$. For example, the peripheral impurity region $13p$ may be an N-type impurity region or a P-type impurity region.

A lower insulating layer 18 is formed on the substrate having the first driver transistor TD1, the first transfer transistor TT1, and the peripheral impurity region $13p$. The lower insulating layer 18 may be formed by sequentially stacking a lower etch stop layer 15 and a lower interlayer insulating layer 17. The lower etch stop layer 15 is preferably formed of an insulating layer having an etching selectivity with respect to the lower interlayer insulating layer 17. For example, when the lower interlayer insulating layer 17 is formed of a silicon oxide layer, the lower etch stop layer 15 may be formed of a silicon nitride layer. In addition, the lower interlayer insulating layer 17 may be planarized until the lower etch stop layer 15 on the driver gate electrode $7d'$ and the transfer gate electrode $7t'$ is exposed.

In other embodiments, the lower insulating layer 18 may be formed of only the lower interlayer insulating layer 17. In other words, the process for forming the lower etch stop layer 15 can be omitted.

Figure 3:
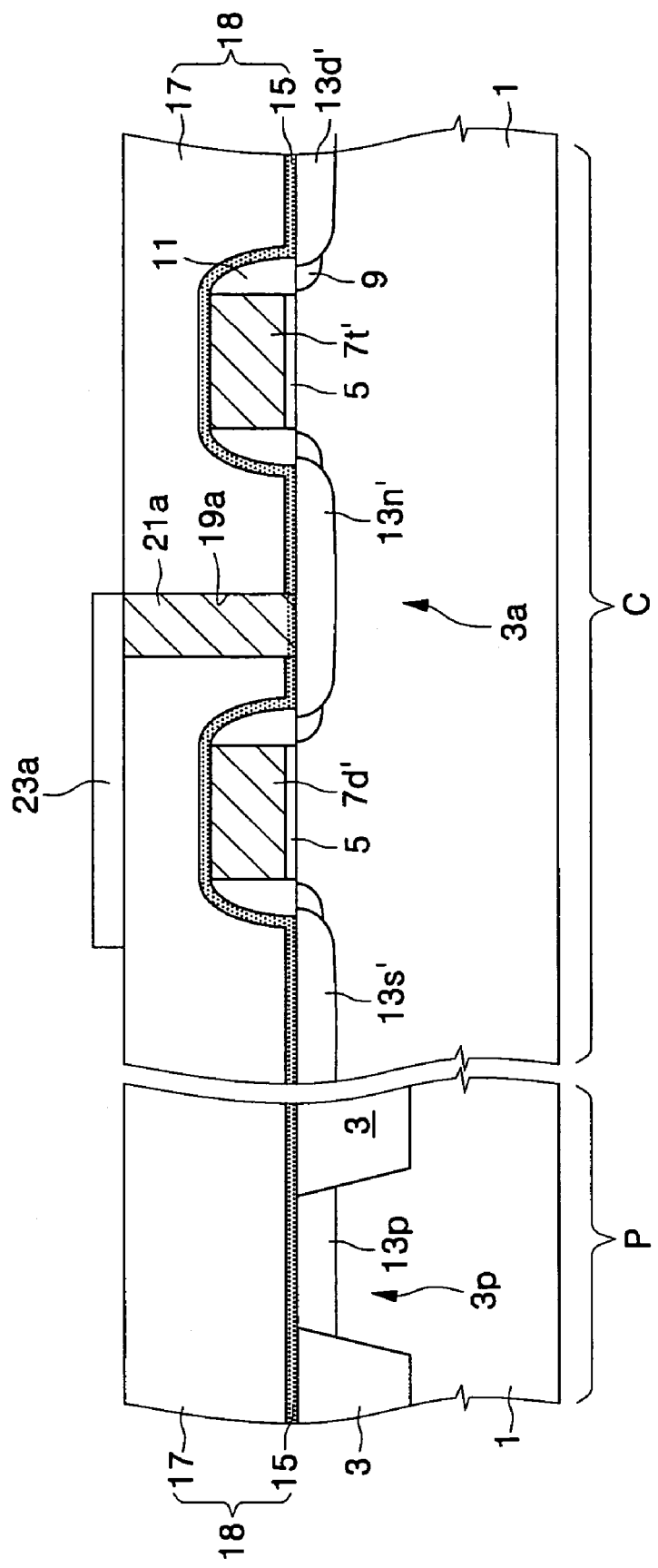

Referring to FIGS. 1 and 3, the lower insulating layer 18 is patterned to form a lower node contact hole $19a$ exposing the node impurity region $13n'$. A semiconductor plug $21a$ is then formed in the lower node contact hole $19a$. The semiconductor plug $21a$ may be formed using a selective epitaxial growth (SEG) process. In this case, the semiconductor plug $21a$ is grown to have the same crystalline structure as the exposed node impurity region $13n'$. For example, in the event that the semiconductor substrate 1 is a single crystalline silicon substrate and the SEG process is performed using a silicon source gas, the semiconductor plug $21a$ is formed to have a single crystalline silicon structure.

On the other hand, it may be difficult to perform the SEG process with an in-situ doping process. Therefore, the semiconductor plug $21a$ may be formed of an intrinsic semiconductor plug. When an upper surface of the single crystalline semiconductor plug $21a$ is higher than an upper surface of the lower insulating layer 18, the single crystalline semiconductor plug $21a$ may be planarized using a chemical mechanical polishing (CMP) process.

A semiconductor body layer is formed on the entire surface of the semiconductor substrate having the single crystalline semiconductor plug $21a$. The semiconductor body layer may be formed of an amorphous semiconductor layer or a polycrystalline semiconductor layer. For example, the semiconductor body layer may be formed of an amorphous silicon layer or a polycrystalline silicon layer. The semiconductor body layer is patterned to form a semiconductor body pattern $23a$ on the lower insulating layer 18. The semiconductor body pattern $23a$ may be formed to cross over the driver gate electrode $7d'$ and to be in contact with the single crystalline semiconductor plug $21a$.

Figure 4:
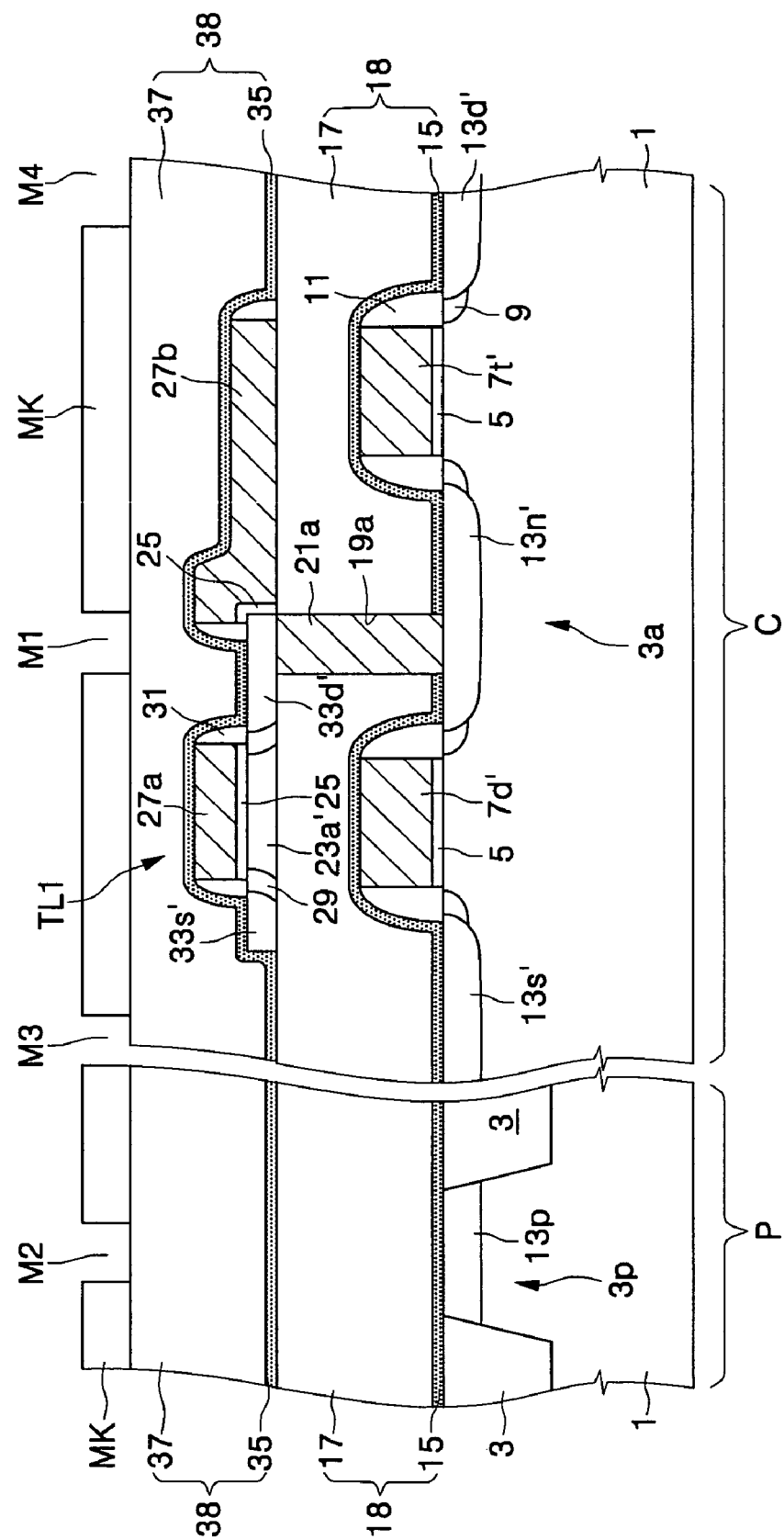

Referring to FIGS. 1 and 4, the semiconductor body pattern $23a$ is crystallized. The crystallization of the semiconductor body pattern 23a may be performed using a solid phase epitaxial (SPE) process well known in the art. For example, the SPE process may be performed at a temperature of about 500° C. to 800° C.

The single crystalline semiconductor plug 21a serves as a seed during the SPE process. That is, the semiconductor body pattern 23a is converted into a single crystalline semiconductor body pattern 23a' having the same crystalline structure as the single crystalline semiconductor plug 21a during the SPE process. For example, in the event that the single crystalline semiconductor plug 21a is a single crystalline silicon plug and the semiconductor body pattern 23a is an amorphous silicon pattern or a polycrystalline silicon pattern, the amorphous silicon pattern or the polycrystalline silicon pattern is converted into a single crystalline silicon pattern by the SPE process.

The crystallization of the semiconductor body pattern 23a may be performed before patterning the semiconductor body layer. However, if the crystallization process is performed before the patterning the semiconductor body layer, grain boundaries may be formed in channel regions of load TFTs to be formed in subsequent processes. In this case, electrical characteristics of the load TFTS may be significantly degraded, and the electrical characteristics of all load TFTs formed throughout the semiconductor substrate 1 may be non-uniform. Therefore, the crystallization process is preferably performed after patterning the semiconductor body layer.

Alternatively, the single crystalline semiconductor body pattern 23a' may be formed using various other methods. For example, the single crystalline semiconductor body pattern 23a' may be formed using a damascene process and a selective epitaxial process instead of the SPE process. That is, formation of the single crystalline semiconductor body pattern 23a' may comprise forming a molding layer (not shown) having an opening for exposing the single crystalline semiconductor plug 21a on the lower insulating layer 18, forming a single crystalline semiconductor layer filling the opening using the SEG process that employs the single crystalline semiconductor plug 21a as a seed layer, and planarizing the single crystalline semiconductor layer using a CMP process.

Subsequently, a gate insulating layer 25 is formed on a surface of the single crystalline semiconductor body pattern 23a'. A gate conductive layer is formed on the substrate having the gate insulating layer 25. The gate conductive layer may be formed of a polycrystalline silicon layer. The gate conductive layer is patterned to form a load gate electrode 27a crossing over the single crystalline semiconductor body pattern 23a'. During formation of the load gate electrode 27a, a second load gate electrode 27b may be formed to overlap with or to be adjacent to the single crystalline semiconductor body pattern 23a' on the single crystalline semiconductor plug 21a. The second load gate electrode 27b corresponds to a gate electrode of the second load transistor (TL2 of FIG. 1).

P-type impurity ions are implanted into the single crystalline semiconductor body pattern 23a' using the load gate electrodes 27a and 27b as ion implantation masks, thereby forming LDD regions 29. Gate spacers 31 are then formed on sidewalls of the load gate electrodes 27a and 27b. P-type impurity ions are implanted into the single crystalline semiconductor body pattern 23a' using the load gate electrodes 27a and 27b and the gate spacers 31 as ion implantation masks. As a result, a drain region 33d' is formed in the single crystalline semiconductor body pattern 23a' which is adjacent to the load gate electrode 27a and is located on the single crystalline semiconductor plug 21a, and a source region 33s' is formed in the single crystalline semiconductor body pattern 23a' which is adjacent to the load gate electrode 27a and is located opposite the drain region 33d'. Therefore, A first load transistor (TL1 of FIG. 1) is formed at the single crystalline semiconductor body pattern 23a'. The load gate electrodes 27a and 27b may be P-type polycrystalline silicon patterns.

An upper insulating layer 38 is formed on the substrate having the first load transistor TL1. The upper insulating layer 38 may be formed by sequentially stacking an upper etch stop layer 35 and an upper interlayer insulating layer 37 having an etching selectivity with respect to the upper etch stop layer 35. When the upper etch stop layer 35 is formed of a silicon nitride layer, the upper interlayer insulating layer 37 may be formed of a silicon oxide layer. The process for forming the upper etch stop layer 35 may be omitted. In this case, the upper insulating layer 38 is formed of only the upper interlayer insulating layer 37.

A mask pattern MK is formed on the upper insulating layer 38. The mask pattern MK may be formed of a hard mask layer or a photoresist layer. The hard mask layer may be formed of an insulating layer such as a silicon oxynitride layer. The mask pattern MK may be formed to have a first opening M1 located over the drain region 33d' of the first load transistor TL1 and a second opening M2 located over the peripheral impurity region 13p. In addition, the mask pattern MK may be formed to have a third opening M3 located over the ground impurity region 13s' and a fourth opening M4 located over the bit line impurity regions 13d'.

Figure 5:
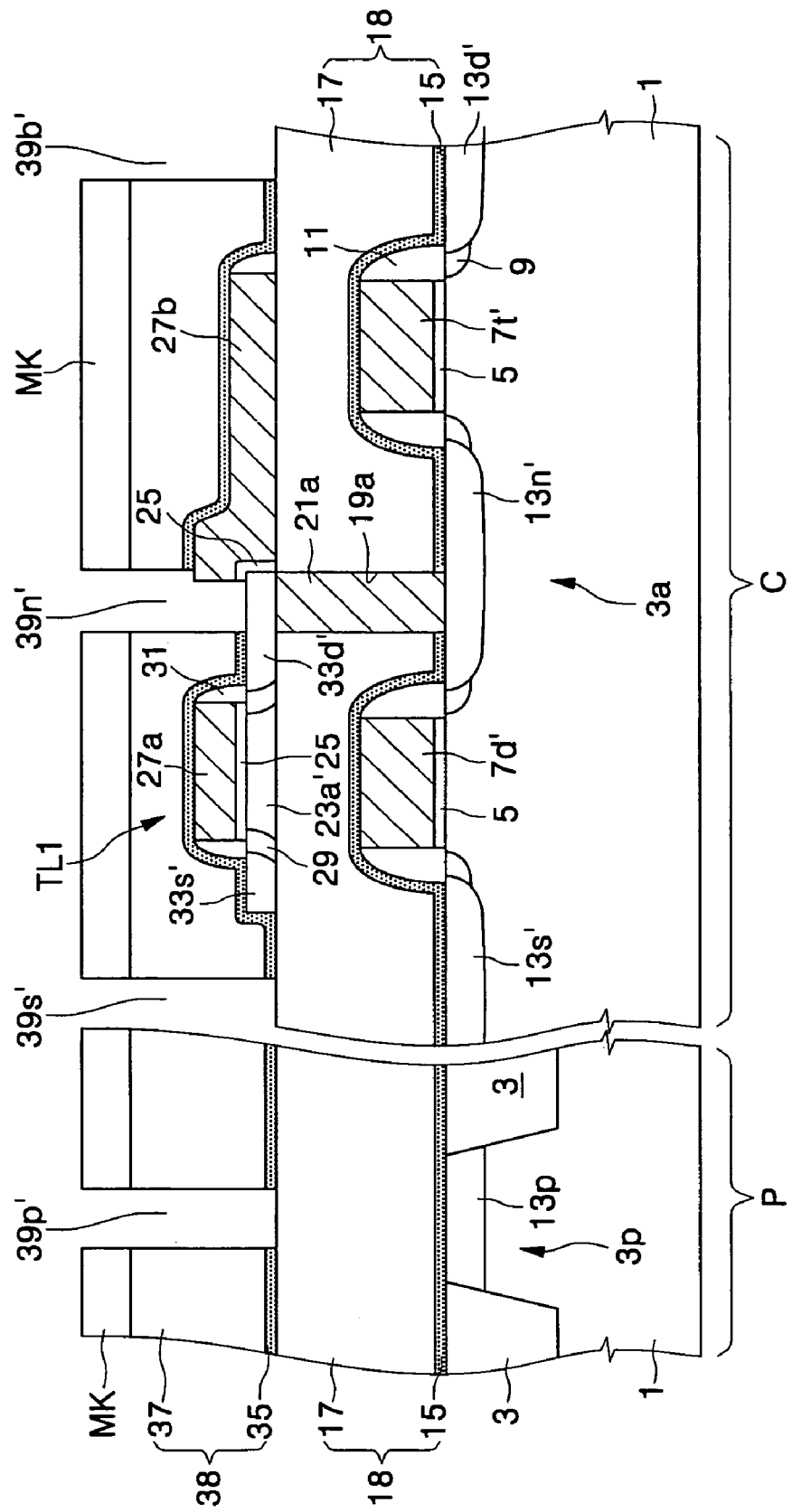

Referring to FIGS. 1 and 5, the upper insulating layer 38 is etched using the mask pattern MK as an etching mask to form an preliminary upper node contact hole 39n' exposing the drain region 33d' and the second load gate electrode 27b. During formation of the preliminary upper node contact hole 39n', a preliminary metal contact hole 39p' may be formed to expose the lower insulating layer 18 over the peripheral impurity region 13p. In addition, during formation of the preliminary upper node contact hole 39n', a preliminary ground contact hole 39s' and a preliminary bit line contact hole 39b' may be formed to expose the lower insulating layer 18 over the ground impurity region 13s' and the bit line impurity region 13d', respectively. In the event that the upper insulating layer 38 is formed to include the upper etch stop layer 35, the upper etch stop layer 35 may prevent the lower insulating layer 18 from being over etched during the formation of the preliminary contact holes 39n', 39p', 39s' and 39b'.

Figure 6:
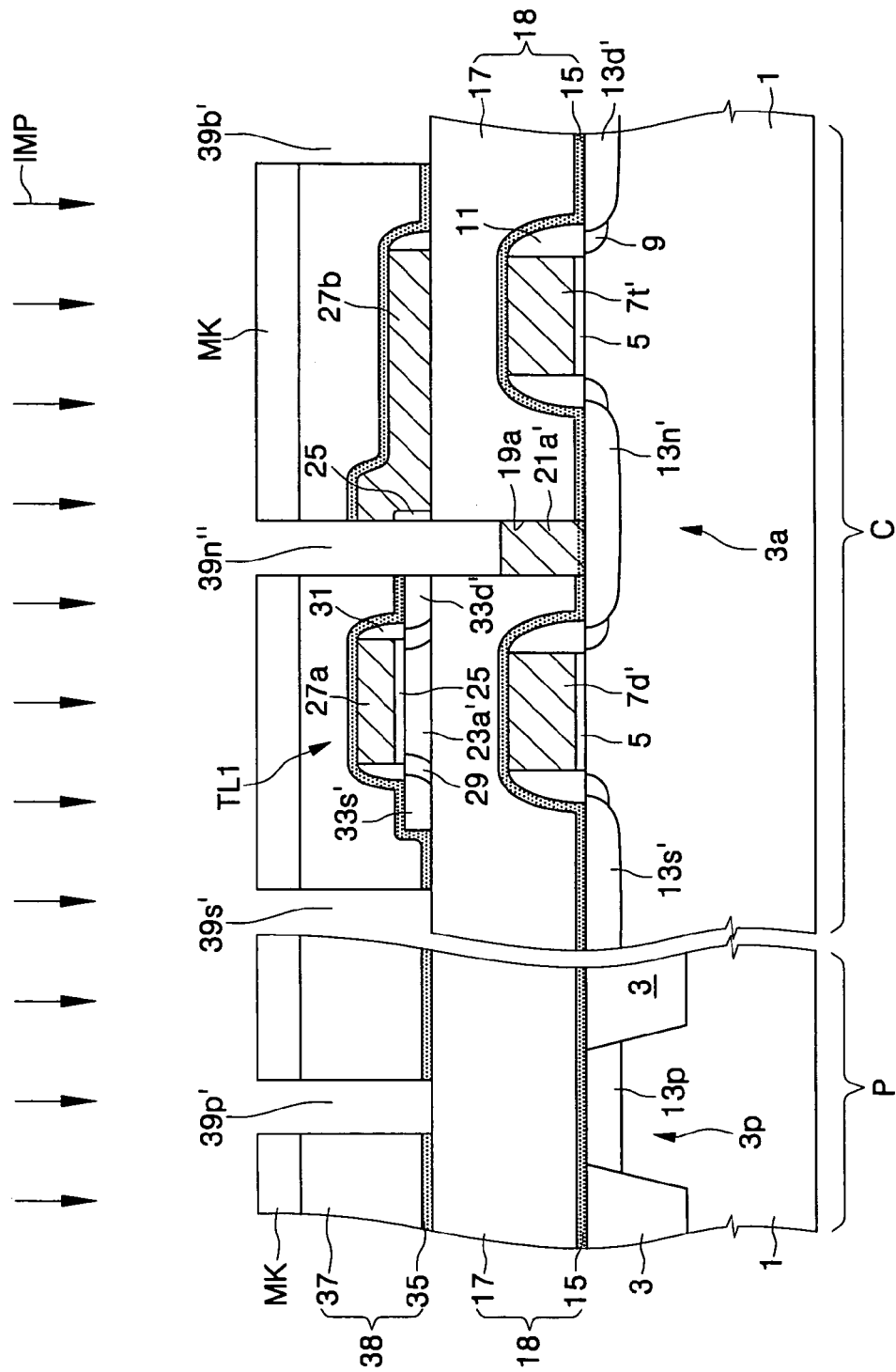

Referring to FIGS. 1 and 6, the exposed drain region 33d' and the single crystalline semiconductor plug 21a are successively etched to form a final upper node contact hole 39n'' that provides a recessed single crystalline semiconductor plug 21a' on the node impurity region 13n'. During formation of the final upper node contact hole 39n'', the impurity regions 13p, 13s', and 13d' are prevented from being exposed. This is because the lower insulating layer 18 has an etching selectivity with respect to the drain region 33d' and the single crystalline semiconductor plug 21a.

Subsequently, the recessed single crystalline semiconductor plug 21a' is selectively doped. The selective doping of the recessed single crystalline semiconductor plug 21a' may be performed using an ion implantation process. In this case, impurity ions IMP can be selectively implanted into the recessed single crystalline semiconductor plug 21a' through the final upper node contact hole 39n''. The impurity ions IMP may have the same conductivity type as the node impurity region 13n'. During implantation of the impurity ions IMP, the exposed lower insulating layer 18 on the impurity regions 13p, 13s' and 13d' serves as an ion implantation mask.

Figure 7:
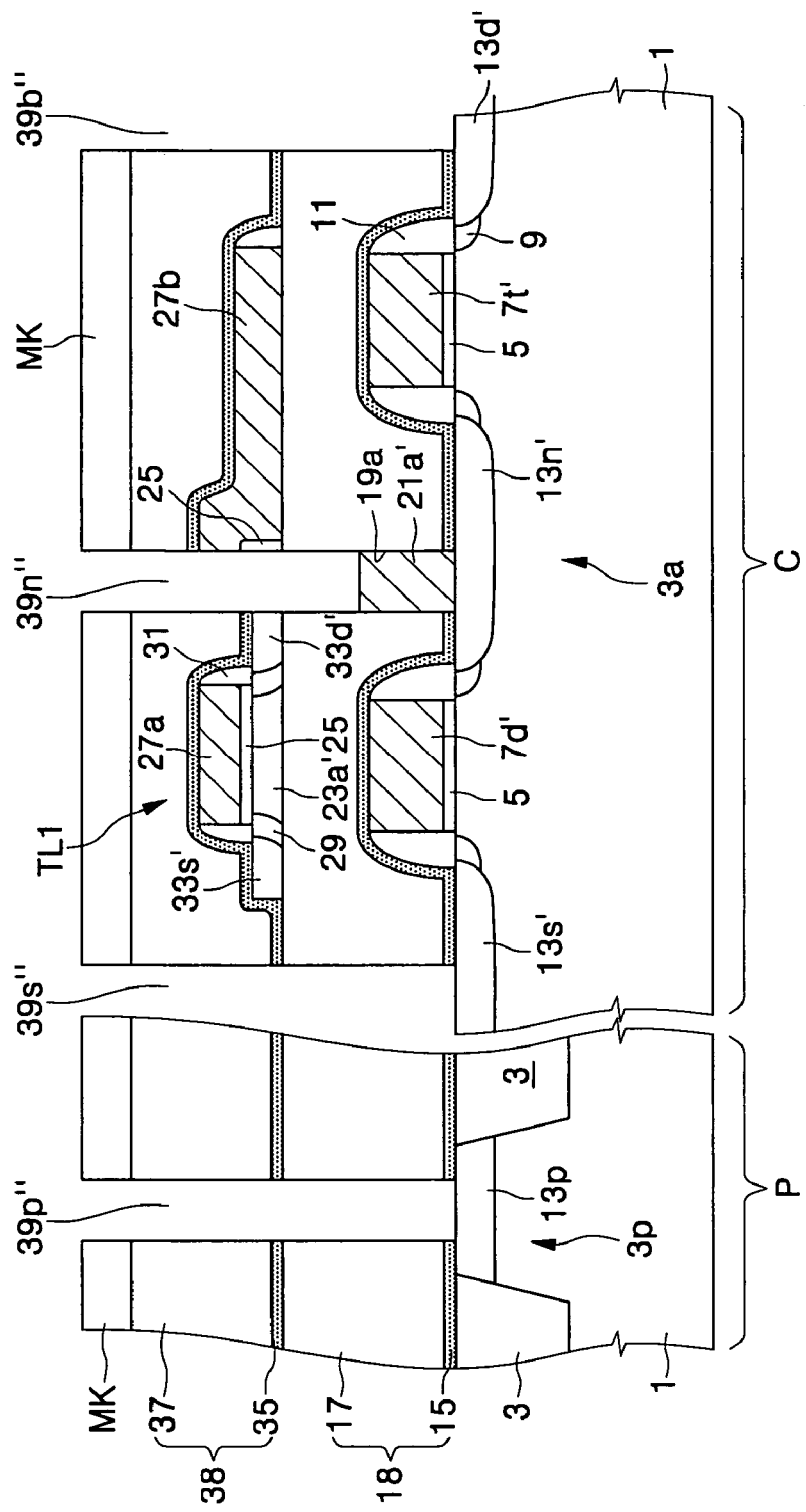

Referring to FIGS. 1 and 7, after doping the recessed single crystalline semiconductor plug 21a', the lower insulating layer 18 is etched using the mask pattern MK as an etching mask. As a result, a final metal contact hole 39p'', a final ground contact hole 39s''and a final bit line contact hole 39b'' are formed to expose the peripheral impurity region 13p, the ground impurity region 13s' and the bit line impurity region 13d', respectively. During formation of the final contact holes 39p'', 39s'', and 39b'', the doped single crystalline semiconductor plug 21a' is prevented from being etched. This is because the doped single crystalline semiconductor plug 21a' has an etching selectivity with respect to the lower insulating layer 18.

Figure 8:
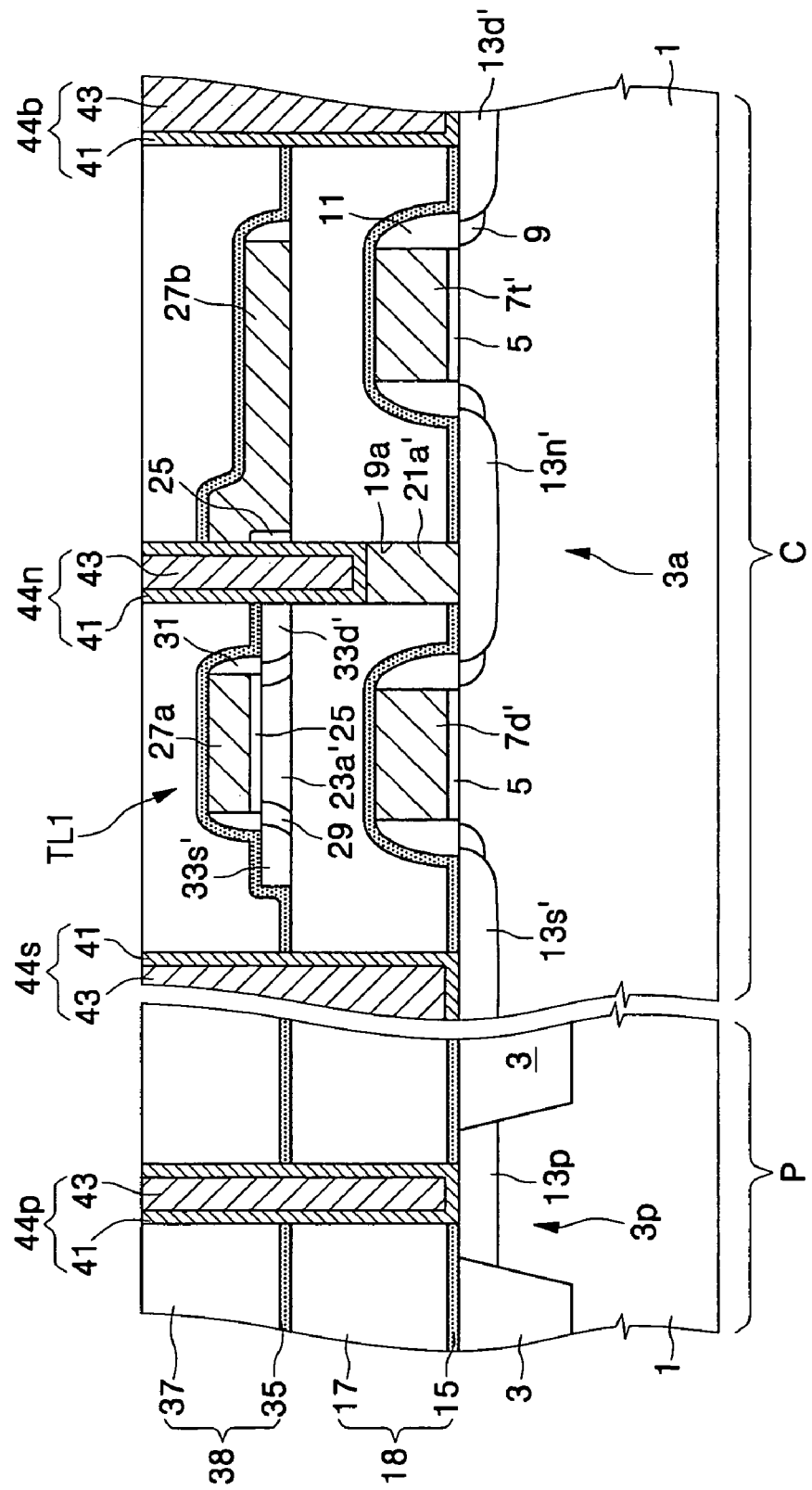

Referring to FIGS. 1 and 8, when the mask pattern MK is a photoresist pattern, a node metal layer is formed on the substrate having the final contact holes 39p'', 39s'' and 39b'' after removal of the mask pattern MK. Alternatively, when the mask pattern MK is a hard mask pattern formed of an insulating layer such as a silicon oxynitride layer, the node metal layer may be formed on the substrate having the final contact holes 39p'', 39s'' and 39b'' without removal of the mask pattern MK. The node metal layer is formed of a metal layer exhibiting ohmic contact with respect to both P-type material and N-type material. For example, the node metal layer may be formed of a tungsten layer. Alternatively, the node metal layer may be formed by sequentially stacking a barrier metal layer and an interconnection metal layer. In this case, the barrier metal layer may be formed of a titanium nitride layer, and the interconnection metal layer may be formed of a tungsten layer.

The node metal layer is planarized to form a node metal plug 44n, a metal contact plug 44p, a ground contact plug 44s, and a bit line contact plug 44b in the final contact holes 39n'', 39p'', 39s'', and 39b'' respectively. When the node metal layer is formed by sequentially stacking the barrier metal layer and the interconnection metal layer, each of the plugs 44n, 44p, 44s, and 44b is formed to have a barrier metal layer pattern 41 and a metal plug 43 surrounded by the barrier metal layer pattern 41.

As described above, when the node metal layer is formed after removal of the mask pattern MK, the planarization of the node metal layer can be performed until the upper insulating layer 38 is exposed. On the contrary, when the node metal layer is a hard mask pattern formed of a silicon oxynitride layer, the node metal layer can be planarized until the mask pattern MK is exposed thereby forming preliminary plugs. The exposed mask pattern MK may be removed using an etchback process. In this case, upper regions of the preliminary plugs may be relatively protruded. The protrusions of the preliminary plugs may be removed using the CMP process. As a result, the plugs 44n, 44p, 44s and 44b are formed as shown in FIG. 8.

The present invention is not limited to the aforementioned embodiments but may be modified in various forms. For example, the present invention can be applicable to fabrication of a node contact structure of a semiconductor device employing a three-dimensional SRAM cell having a driver transistor, a load TFT stacked on the driver transistor, and a transfer TFT stacked on the load TFT.

According to embodiments of the present invention, an intrinsic single crystalline semiconductor plug is formed to pass through a lower insulating layer using a selective epitaxial growth process employing a node impurity region as a seed layer, and a single crystalline semiconductor body pattern is formed on the lower insulating layer using the intrinsic single crystalline semiconductor plug as a seed layer. A thin film transistor is formed at the single crystalline semiconductor body pattern, and a drain region of the thin film transistor and the single crystalline semiconductor plug are etched to form a recessed single crystalline semiconductor plug on the node impurity region. In this case, the lower insulating layer is remained on a peripheral impurity region having a different conductivity type from the node impurity region. Accordingly, when the recessed single crystalline semiconductor plug is doped with impurities having the same conductivity type as the node impurity region, it can prevent the peripheral impurity region from being counter-doped. As a result, it is possible to implement a high performance semiconductor device that requires a single crystalline thin film transistor as well as a node contact structure with ohmic contact.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A method of fabricating a node contact structure, comprising:
    forming a lower impurity region of a first conductivity type in a predetermined region of a semiconductor substrate;
    forming a lower insulating layer on the substrate having the lower impurity region;
    forming a single crystalline semiconductor plug passing through the lower insulating layer to be in contact with the lower impurity region;
    forming a single crystalline semiconductor body pattern on the lower insulating layer, the single crystalline semiconductor body pattern being formed to contact the single crystalline semiconductor plug;
    forming an upper impurity region of a second conductivity type in the single crystalline semiconductor body pattern, the upper impurity region being formed on the single crystalline semiconductor plug;
    forming an upper insulating layer on the substrate having the upper impurity region;
    etching the upper insulating layer, the upper impurity region and the single crystalline semiconductor plug to form an upper node contact hole that provides a recessed single crystalline semiconductor plug on the lower impurity region;
    selectively doping the recessed single crystalline semiconductor plug to form a doped semiconductor plug having the first conductivity type; and
    forming a node metal plug in the upper node contact hole, the node metal plug being in contact with the doped semiconductor plug.

2. The method according to claim 1, wherein the semiconductor substrate is a single crystalline semiconductor substrate.

3. The method according to claim 1, wherein the first conductivity type is an N-type, and the second conductivity type is a P-type.

4. The method according to claim 1, wherein the lower insulating layer is formed by sequentially stacking a lower etch stop layer and a lower interlayer insulating layer having an etching selectivity with respect to the lower etch stop layer.

5. The method according to claim 1, wherein the single crystalline semiconductor plug is an intrinsic semiconductor plug.

6. The method according to claim 5, wherein forming the intrinsic semiconductor plug comprises:
    patterning the lower insulating layer to form a lower node contact hole exposing the lower impurity region; and growing an intrinsic single crystalline semiconductor layer in the lower node contact hole using a selective epitaxial growth process that employs the lower impurity region as a seed layer.

7. The method according to claim 1, wherein forming the single crystalline semiconductor body pattern comprises:
forming a semiconductor body layer on the substrate having the single crystalline semiconductor plug;
patterning the semiconductor body layer to form a semiconductor body pattern contacting the single crystalline semiconductor plug; and
crystallizing the semiconductor body pattern using a solid phase epitaxial process that employs the single crystalline semiconductor plug as a seed layer.

8. The method according to claim 1, wherein the upper insulating layer is formed by sequentially stacking an upper etch stop layer and an upper interlayer insulating layer having an etching selectivity with respect to the upper etch stop layer.

9. The method according to claim 1, wherein selectively doping the recessed single crystalline semiconductor plug is performed using an ion implantation process.

10. The method according to claim 1, wherein forming the node metal plug comprises:
forming a node metal layer on the substrate having the doped semiconductor plug; and planarizing the node metal layer.

11. The method according to claim 10, wherein the node metal layer is formed of a metal layer having ohmic contact with respect to both of the doped semiconductor plug and the upper impurity region.

12. A method of fabricating a node contact structure, comprising:
forming a lower impurity region of a first conductivity type in a predetermined region of a semiconductor substrate;
forming a lower insulating layer on the substrate having the lower impurity region;
forming a single crystalline semiconductor plug passing through the lower insulating layer to be in contact with the lower impurity region;
forming a single crystalline semiconductor body pattern on the lower insulating layer, the single crystalline semiconductor body pattern being formed to contact the single crystalline semiconductor plug;
forming an upper impurity region of a second conductivity type in the single crystalline semiconductor body pattern, the upper impurity region being formed on the single crystalline semiconductor plug;
forming an upper insulating layer on the substrate having the upper impurity region;
etching the upper insulating layer, the upper impurity region and the single crystalline semiconductor plug to form an upper node contact hole that provides a recessed single crystalline semiconductor plug on the lower impurity region; and
selectively doping the recessed single crystalline semiconductor plug to form a doped semiconductor plug having the first conductivity type.

* * * * *

UNITED STATES PATENT AND TRADEMARK OFFICE
CERTIFICATE OF CORRECTION

PATENT NO. : 7,387,919 B2 Page 1 of 1
APPLICATION NO. : 11/281346
DATED : June 17, 2008
INVENTOR(S) : Kun-Ho Kwak et al.

It is certified that error appears in the above-identified patent and that said Letters Patent is hereby corrected as shown below:

Column 6, line 50, the word "21*a*is" should read -- 21*a* is --.

Signed and Sealed this

Seventh Day of April, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,387,919 B2  
APPLICATION NO. : 11/281346  
DATED : June 17, 2008  
INVENTOR(S) : Kun-Ho Kwak et al.

Page 1 of 1

It is certified that error appears in the above-identified patent and that said Letters Patent is hereby corrected as shown below:

Title Page:
Add Item -- (73) Assignee: Samsung Electronics Co., LTD, Suwon-si, Gyeonggi-do, Republic of Korea --.

Signed and Sealed this

Second Day of June, 2009

JOHN DOLL  
*Acting Director of the United States Patent and Trademark Office*